United States Patent
Kim

(10) Patent No.: US 8,006,148 B2
(45) Date of Patent: Aug. 23, 2011

(54) TEST MODE CONTROL CIRCUIT AND METHOD FOR USING THE SAME IN SEMICONDUCTOR MEMORY DEVICE

(75) Inventor: Bo-Yeun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 233 days.

(21) Appl. No.: 12/345,157

(22) Filed: Dec. 29, 2008

(65) Prior Publication Data

US 2010/0005350 A1 Jan. 7, 2010

(30) Foreign Application Priority Data

Jul. 7, 2008 (KR) .................. 10-2008-0065707

(51) Int. Cl.
*G01R 31/28* (2006.01)
(52) U.S. Cl. ........ 714/724; 714/742; 714/718; 714/721; 714/25; 714/30; 714/36; 365/201
(58) Field of Classification Search .......... None
See application file for complete search history.

(56) References Cited

U.S. PATENT DOCUMENTS

| | | | | | |
|---|---|---|---|---|---|
| 5,365,481 | A | * | 11/1994 | Sawada | 365/201 |
| 5,781,485 | A | * | 7/1998 | Lee et al. | 365/201 |
| 6,144,594 | A | * | 11/2000 | McClure | 365/201 |
| 7,107,500 | B2 | * | 9/2006 | Jang | 714/718 |
| 7,155,644 | B2 | * | 12/2006 | Roohparvar | 714/718 |
| 7,213,188 | B2 | * | 5/2007 | Louie et al. | 714/742 |
| 7,689,883 | B2 | * | 3/2010 | Seo | 714/724 |
| 2001/0015654 | A1 | * | 8/2001 | Habersetzer et al. | 324/763 |
| 2002/0175698 | A1 | * | 11/2002 | Goodman | 326/8 |
| 2003/0009713 | A1 | * | 1/2003 | Endou | 714/724 |
| 2007/0168780 | A1 | * | 7/2007 | Janzen | 714/718 |
| 2008/0163018 | A1 | * | 7/2008 | Seo | 714/726 |

FOREIGN PATENT DOCUMENTS

JP 11-144498 * 5/1999

OTHER PUBLICATIONS

Notice of Preliminary Rejection issued from Korean Intellectual Property Office on Sep. 29, 2009 with an English Translation.

* cited by examiner

*Primary Examiner* — John P Trimmings
(74) *Attorney, Agent, or Firm* — IP & T Group LLP

(57) ABSTRACT

A test mode control circuit of a semiconductor memory device includes an input unit configured to input test mode data for at least one of a plurality of test modes, and a test mode controlling unit configured to enable/disable a test mode according to the number of inputs of the test mode data.

21 Claims, 3 Drawing Sheets ably provided in the DRAM.

TEST MODE CONTROL CIRCUIT AND METHOD FOR USING THE SAME IN SEMICONDUCTOR MEMORY DEVICE

CROSS-REFERENCE TO RELATED APPLICATIONS

The present invention claims priority of Korean patent application number 10-2008-0065707, filed on Jul. 7, 2008, which is incorporated by reference in its entirety.

BACKGROUND OF THE INVENTION

The present invention relates to a semiconductor memory device, and more particularly, to a test mode control circuit of a semiconductor memory device and a method for controlling a test mode of the semiconductor memory device.

A test mode is typically used to analyze a failure of a semiconductor memory device such as a dynamic random access memory (DRAM) during the development and mass-production of the semiconductor memory device. The test mode is not a normal function but a special function additionally provided in the DRAM.

The test mode is enabled (or set) when a predetermined test mode command and a test code are inputted. The test mode is disabled (or reset) when a predetermined mode register set (MRS) code is inputted or a system enters a power-up mode.

FIG. 1 illustrates a conventional test mode control circuit of a semiconductor memory device. A signal TRSTPB is a pulse signal having a logic low level when an MRS code is inputted. A signal TSET is a pulse signal having a logic high level, which is generated by the combination of a test mode command and a corresponding test code. Signals TRG1 and TRG2 are generated by decoding the test code. When the test mode command and the test code are inputted, the signals TSET, TRG1 and TRG2 go to logic high level and a node N1 goes to logic low level. As a result, a signal TM goes to logic high level, and the test mode is enabled. The signal TM is a control signal for enabling/disabling the test mode. A signal having the same level is maintained at the node N1 by a latch until the MRS code is inputted.

To analyze failures of a semiconductor memory device, a single test mode may be used or a plurality of test modes may be used. For example, a multibit test, a redundancy cell replacement test, a wafer burn-in test may be performed. Meanwhile, there is a situation where only one test mode should be enabled among the plurality of test modes. To this end, the MRS code should be inputted or a system should enter a power-up mode. Thereafter, a test is re-performed by inputting the test mode command and test codes for target test modes except for undesired test modes. However, such a method causes a test program to be complicated and a test time to be increased as well.

In particular, to reset all the test modes during a package test, the MRS code cannot be inputted but a system should be rebooted because the system does not support it. This makes things complicated and requires much more time. Moreover, the package test is performed using a development board that has an unstable system so that a normal booting cannot be performed even if the system is rebooted.

SUMMARY OF THE INVENTION

Exemplary embodiments of the present invention are directed to a test mode control circuit and a method for using the same in a semiconductor memory device. The circuit and method can resolve the complexity of a test program, reduce test time, and facilitate a test procedure when it is necessary to reset and operate a specific test mode among a plurality of test modes to analyze device failure.

In accordance with an aspect of the present invention, there is provided a test mode control circuit of a semiconductor memory device, which includes an input unit configured to input test mode data for at least one of a plurality of test modes, and a test mode controlling unit configured to enable/disable the test mode according to the number of inputs of the test mode data.

In accordance with another aspect of the present invention, there is provided a method of controlling a test mode of a semiconductor memory device, which includes performing an input operation for inputting test mode data for at least one of a plurality of test modes, and performing a control operation for controlling the test mode to be enabled/disabled according to the number of inputs of the test mode data.

DESCRIPTION OF SPECIFIC EMBODIMENTS

Other objects and advantages of the present invention can be understood by the following description, and become apparent with reference to the embodiments of the present invention.

Figure 1:
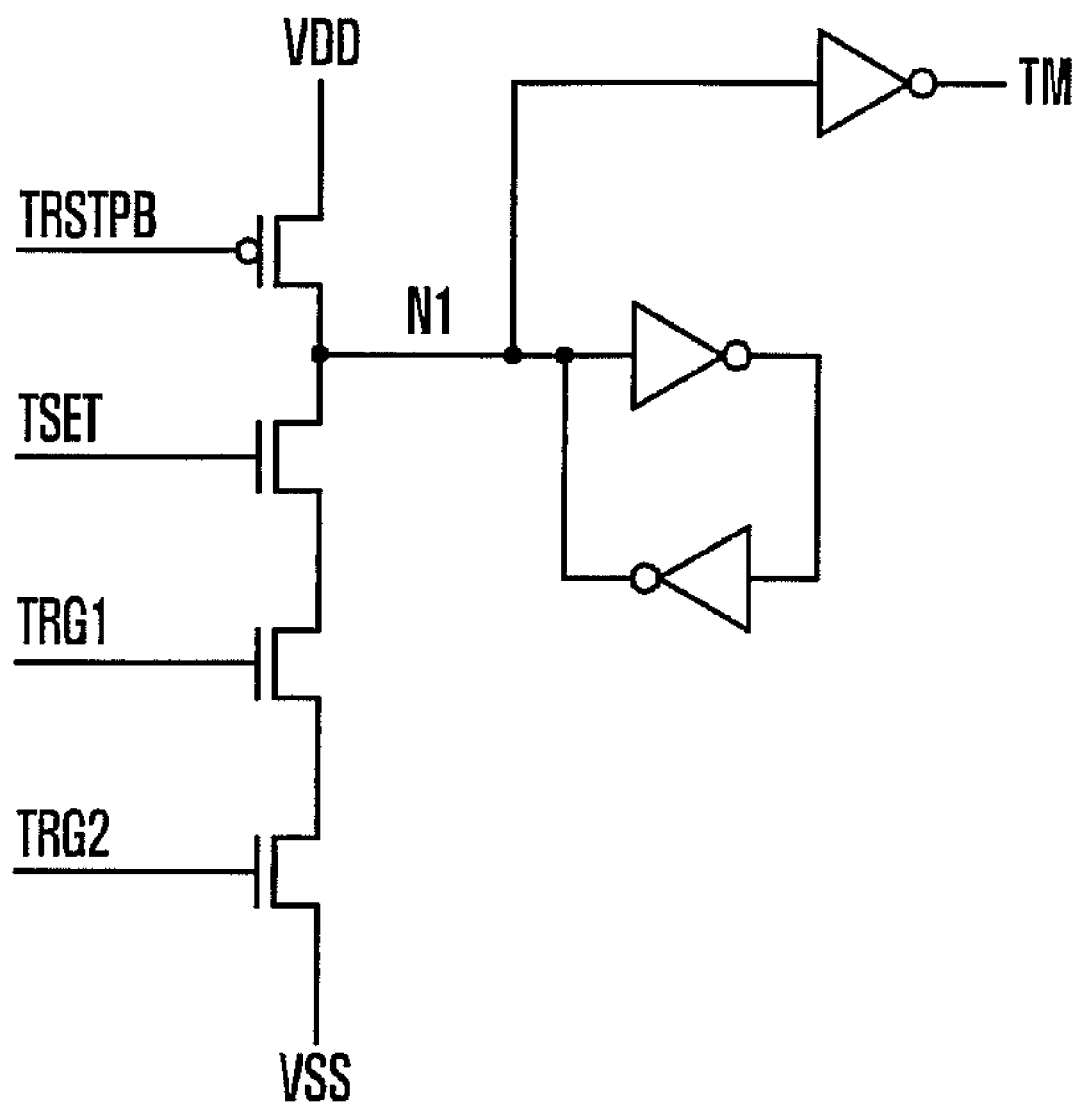
FIG. 1 is a circuit diagram of a conventional test mode control circuit for use in a semiconductor memory device.
Figure 2:
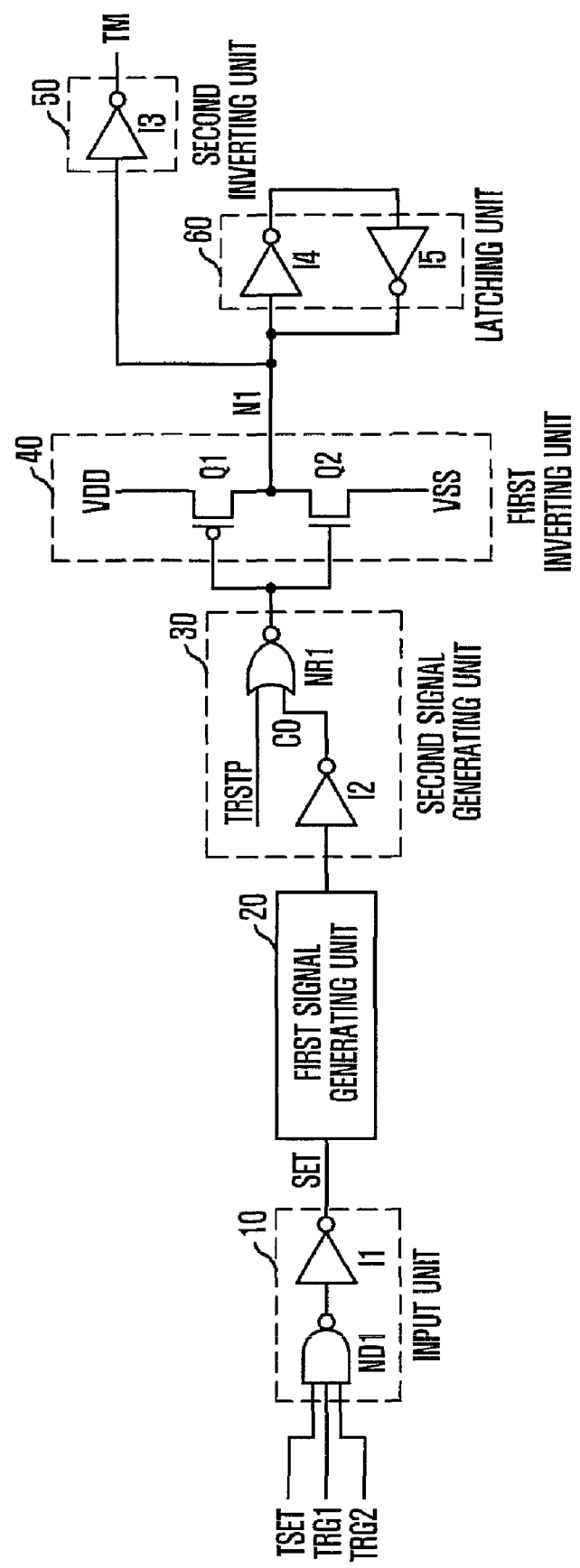
FIG. 2 is a block diagram of a test mode control circuit in accordance with an embodiment of the present invention.

FIG. 2 illustrates a block diagram of a test mode control circuit in accordance with an embodiment of the present invention.

Referring to FIG. 2, the test mode control circuit in accordance with the embodiment of the present invention generates a test control signal TM for controlling a test mode to be enabled or disabled. To this end, the test mode control circuit includes an input unit 10, a first signal generating unit 20, and a second signal generating unit 30. In addition, the test mode control circuit further includes a first inverting unit 40, a second inverting unit 50, and a latching unit 60. The input unit 10 receives signals TSET, TRG1, and TRG2. The signal TSET is a high active pulse generated by combining a test mode command and a test mode code. The signals TRG1 and TRG2 are generated by decoding the test mode code. That is, the input unit 10 receives the test mode command and the test mode code that indicates a test mode data for at least one of a plurality of test modes.

The input unit 10 includes a NAND gate ND1 and an inverter I1. The NAND gate ND1 performs NAND operation on the test mode command and the test mode data for at least one of the test modes. The inverter I1 inverts an output signal of the NAND gate ND1.

The first and second signal generating units 20 and 30 generate a source signal for controlling the test mode to be enabled/disabled according to the number of inputs of the test mode data. When the test mode data is inputted, the first and second signal generating units 20 and 30 generate the source signal to enable the test mode. Thereafter, when the test mode data is inputted again, the first and second signal generating units 20 and 30 generate the source signal to disable the test mode. The first and second signal generating units 20 and 30 generate the source signal to disable the plurality of test modes when a predetermined reset signal TRSTP is inputted.

The predetermined reset signal TRSTP is a signal that goes to logic high level when a mode register set (MRS) code is inputted.

The first signal generating unit 20 generates a control signal, which alternately has a first level, e.g., high level, (hereinafter, referred to as 'first level control signal') in response to an input of the test mode data, and a second level, e.g., low level, (hereinafter, referred to as 'second level control signal') in response to a re-input of the test mode data. The first signal generating unit 20 may be configured with a 1-bit counter.

The second signal generating unit 30 receives the reset signal TRSTP and an output signal of the first signal generating unit 20, and generates the source signal. The source signal enables the test mode when the first level control signal is inputted, and disables the test mode when the second level control signal or the reset signal is inputted.

The second signal generating unit 30 includes an inverter I2 and a NOR gate NR1. The inverter I2 inverts the output signal of the first signal generating unit 20. The NOR gate NR1 performs NOR operation on the reset signal TRSTP and an output signal of the inverter I2. The NOR gate NR1 generates the source signal to enable the test mode when the first level control signal is inputted, and to disable the test mode when the second level control signal or the reset signal is inputted.

The first inverting unit 40 inverts an output signal of the second signal generating unit 30. The second inverting unit 50 inverts an output signal N1 of the first inverting unit 40 to output a test control signal TM. The first inverting unit 40 includes a first field effect transistor (FET) Q1 and a second FET Q2. The first FET Q1 may be configured with a PMOS FET that includes a first terminal (i.e., gate) receiving an output signal of the second signal generating unit 30, a second terminal (source) connected to a power supply voltage (VDD) terminal, and a third terminal (drain) connected to an input terminal of the second inverting unit 50. The second FET Q2 may be configured with an NMOS FET that includes a first terminal (i.e., gate) receiving the output signal of the second signal generating unit 30, a second terminal (drain) connected to the input terminal of the second inverting unit 50, and a third terminal (source) connected to a ground voltage (VSS) terminal. The second inverting unit 50 may include an inverter configured to invert the output signal N1 of the first inverting unit 40 to output the test control signal TM.

The latching unit 60 maintains a level of the output signal N1 of the first inverting unit 40. The latching unit 60 may be provided with two inverters I4 and I5. In the inverter I4, an input terminal is connected to an output terminal of the first inverting unit 40 and an input terminal of the second inverting unit 50, and an output terminal is connected to an input terminal of the inverter I5. In the inverter I5, the input terminal is connected to the output terminal of the inverter I4, and an output terminal is connected to the output terminal of the first inverting unit 40 and the input terminal of the second inverting unit 50.

Figure 3:
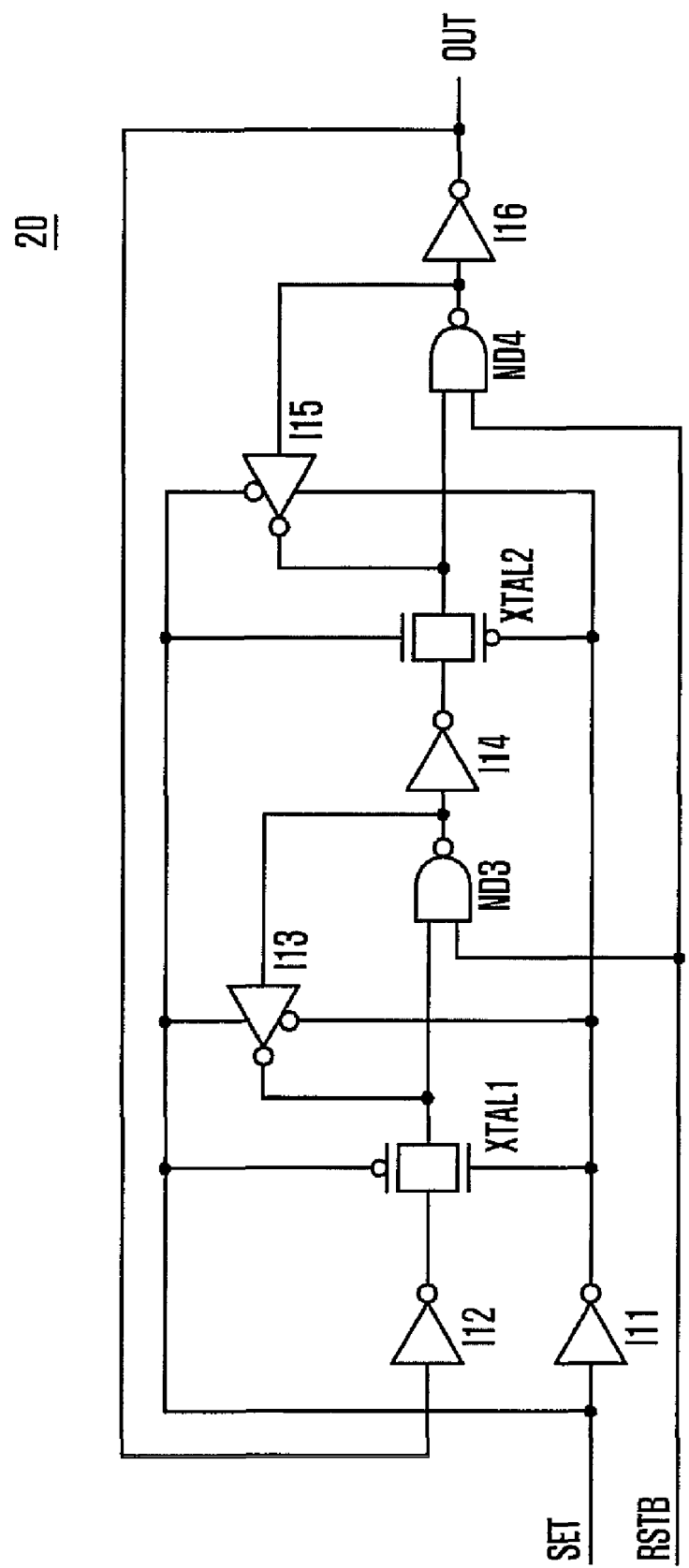
FIG. 3 is a circuit diagram of a 1-bit counter functioning as a first signal generation unit in FIG. 2.

FIG. 3 illustrates a circuit diagram of a 1-bit counter functioning as the first signal generating unit 20 in FIG. 2.

Referring to FIG. 3, the 1-bit counter includes six inverters I11, I12, I13, I14, I15 and I16, two NAND gates ND3 and ND4, and two crystal oscillators XTAL1 and XTAL2. In the inverter I11, an input terminal is connected so as to receive a signal SET, and an output terminal is connected to a second terminal (i.e., non-inverting terminal) of the crystal oscillator XTAL1, an inverting control terminal of the inverter I13, a first terminal (i.e., inverting terminal) of the crystal XTAL2, and a non-inverting control terminal of the inverter I15. In the inverter I12, an input terminal is connected to receive an output signal OUT of the inverter I16, and an output terminal is connected to a first control terminal of the crystal oscillator XTAL1. In the crystal oscillator XTAL1, a first terminal (i.e., inverting terminal) is connected to receive the SET signal, the second terminal (i.e., non-inverting terminal) is connected to the output terminal of the inverter I11, the first control terminal is connected to the output terminal of the inverter I12, and a second control terminal is connected to an output terminal of the inverter I13 and a first input terminal of the NAND gate ND3.

In the NAND gate ND3, the first input terminal is connected to the second control terminal of the crystal oscillator XTAL1 and the output terminal of the inverter I13, a second input terminal is connected to receive an RSTB signal, and an output terminal is connected to an input terminal of the inverter I13 and an input terminal of the inverter I14. In the inverter I13, the input terminal is connected to the output terminal of the NAND gate ND3 and the input terminal of the inverter I14, and the output terminal is connected to the second control terminal of the crystal oscillator XTAL1 and the first input terminal of the NAND gate ND3. Furthermore, a non-inverting control terminal of the inverter I13 is connected to receive the SET signal, and an inverting control terminal of the inverter I13 is connected to the output terminal of the inverter I11. In the inverter I14, the input terminal is connected to the output terminal of the NAND gate ND3 and the input terminal of the inverter I13, and an output terminal is connected to a first control terminal of the crystal oscillator XTAL2.

In the crystal oscillator XTAL2, the first terminal (i.e., inverting terminal) is connected to the output terminal of the inverter I11, a second terminal (i.e., non-inverting terminal) is connected to receive the SET signal, the first control terminal is connected to the output terminal of the inverter I14, and a second control terminal is connected to an output terminal of the inverter I15 and a first input terminal of the NAND gate ND4.

In the NAND gate ND4, the first input terminal is connected to the second control terminal of the crystal oscillator XTAL2 and the output terminal of the inverter I15, a second input terminal is connected to receive the RSTB signal, and an output terminal is connected to an input terminal of the inverter I15 and an input terminal of the inverter I16. In the inverter I15, the input terminal is connected to the output terminal of the NAND gate ND4 and an input terminal of the inverter I16, an output terminal is connected to the second control terminal of the crystal oscillator XTAL2 and the first input terminal of the NAND gate ND4, an inverting control terminal is connected to receive the SET signal, and the non-inverting control terminal is connected to the output terminal of the inverter I11. In the inverter I16, the input terminal is connected to the output terminal of the NAND gate ND4 and the input terminal of the inverter I15, and an output terminal is connected to the input terminal of the inverter I12. The final output signal OUT of the 1-bit counter is outputted through the output terminal of the inverter I16.

The 1-bit counter receives the SET signal and the RSTB signal to thereby output the OUT signal. The RSTB signal, which is a signal of which a logic level changes to high level from low level during a power-up mode, is inputted to the NAND gates ND3 and ND4. The RSTB signal is used for an initial operation of the counter. That is, since the output signals of the NAND gates ND3 and ND4 have logic high levels at an initial operation by virtue of the RSTB signal, the output signal OUT is set to logic low level at the initial operation. The SET signal is a signal having logic high level when the test mode code is inputted. The counter performs 1-bit counting operation to output the OUT signal of logic high level in response to the first input of the SET signal, and then output the OUT signal of logic low level in response to the re-input of the SET signal.

Referring again to FIG. 2, the TSET signal, and the TRG1 and TRG2 signals are at logic high level when a test mode command and a specific test mode code are inputted. The NAND gate ND1 of the input unit 10 receives the TSET signal, and the TRG1 and TRG2 signals of logic high level to output a low level signal. The inverter I1 of the input unit 10 inverts the low level signal to output the SET signal of logic high level. When the SET signal of logic high level is inputted, the first signal generating unit 20, which may be configured with the 1-bit counter, outputs a high level signal, and the inverter I2 of the second signal generating unit 30 outputs a CO signal of logic low level. At this time, the reset signal TRSTP has a logic low level, and thus the NOR gate NR1 of the second signal generating unit 30 outputs a high level signal. The output signal N1 of the first inverting unit 40 has a logic low level, and is latched by the latching unit 60. Consequently, the test control signal TM outputted through the second inverting unit 50 goes to logic high level, thus enabling a corresponding test mode.

When the test mode command and the previously-inputted test mode code are inputted again, the SET signal goes to logic high level. When the SET signal is inputted again, the first signal generating unit 20 outputs a low level signal. The inverter I2 of the second signal generating unit 30 inverts the output signal of the first signal generating unit 20 to thereby output a high level signal, and the NOR gate NR1 outputs a low level signal. The output signal N1 of the first inverting unit 40 has a logic high level, and is latched by the latching unit 60. Therefore, the test control signal TM outputted through the second inverting unit 50 goes to logic low level, thus disabling the corresponding test mode.

When the test mode command and the test mode code are inputted once more, a corresponding test mode is enabled (set); and, when the test mode command and the test mode code are inputted once more again, the corresponding test mode is disabled(reset). In this way, the enabling and disabling of the test mode are alternately repeated according to the number of inputs. This repetitive operation is attributed to the 1-bit counting operation in response to the input of the SET signal because the first signal generation unit 20 is configured with the 1-bit counter.

When the MRS code is inputted during this operation, the reset signal TRSTP goes to logic high level and the test mode is thus disabled. At this point, when one test mode is performed, only that test mode is disabled. However, when a plurality of test modes are performed, all the test modes are disabled at the same time.

As described above, in accordance with the embodiment of the present invention, when a semiconductor memory device is tested in several test modes, the specific test mode is set (or enabled) at inputting the corresponding test mode code and is reset (disabled) at re-inputting the test mode code. This makes it possible to simplify test program and reduce test time, and also provide expediency to a tester. In addition, it is possible to avoid inconvenience resulting from the rebooting during a package test.

Furthermore, in accordance with the present invention, only a desired test mode can be disabled without the input of an MRS code or the reboot of a system even though a plurality of test modes are inputted to test a semiconductor memory device. Therefore, it is possible to simplify a test program, save test time, and facilitate a test procedure.

While the present invention has been described with respect to the specific embodiments, it will be apparent to those skilled in the art that various changes and modifications may be made without departing from the spirit and scope of the invention as defined in the following claims.

The foregoing embodiment describes that the first signal generating unit 20, which alternately generates a high level signal and a low level signal in response to the input of the SET signal (i.e., high level signal→low level signal→high level signal, . . . ), is implemented with the 1-bit counter. However, the operation of changing only a level of a signal and alternately generating the signal in response to the repetitive input of the same signal can be implemented with a processor or the like.

What is claimed is:

1. A test mode control circuit of a semiconductor memory device, comprising:
    an input unit configured to input test mode data for at least one of a plurality of test modes; and
    a test mode controlling unit configured to alternately enable and disable a test mode according to the number of times the test mode data is inputted.

2. The test mode control circuit of claim 1, wherein the test mode controlling unit includes a signal generating unit for generating a test control signal to enable the test mode when the test mode data is inputted, and for generating the test control signal to disable the test mode when the test mode data is inputted again.

3. The test mode control circuit of claim 2, wherein the test mode controlling unit is configured to generate the test control signal to disable the plurality of test modes when a predetermined reset signal is inputted.

4. The test mode control circuit of claim 1, wherein the test mode controlling unit includes:
    a first signal generating unit configured to alternately generate a first level control signal in response to an input of the test mode data, and a second level control signal in response to a re-input of the test mode data; and
    a second signal generating unit configured to receive a reset signal and an output signal of the first signal generating unit to generate a test control signal for enabling the test mode when the first level control signal is inputted, and generate the test control signal for disabling the test mode when the second level control signal or the reset signal is inputted.

5. The test mode control circuit of claim 4, wherein the test mode controlling unit further includes:
    a first inverting unit configured to invert an output signal of the second signal generating unit; and
    a second inverting unit configured to invert an output signal of the first inverting unit to output the test control signal.

6. The test mode control circuit of claim 4, wherein the first signal generating unit includes a 1-bit counter configured to alternately generate the first level control signal and the second level control signal in response to the test mode data.

7. The test mode control circuit of claim 4, wherein the second signal generation unit includes:
    an inverter configured to invert an output signal of the first signal generation unit; and
    a NOR gate configured to perform a NOR operation on an output signal of the inverter and the reset signal.

8. The test mode control circuit of claim 5, wherein the first inverting unit includes:
    a first field effect transistor (FET) connected between a power supply voltage terminal and an input terminal of the second inverting unit configured to receive an output signal of the second signal generating unit through a gate; and a second FET connected between the input terminal of the second inversion unit and a ground voltage terminal configured to receive the output signal of the second signal generating unit through a gate.

9. The test mode control circuit of claim 5, wherein the second inverting unit includes an inverter configured to invert the output signal of the first inverting unit to output the test control signal.

10. The test mode control circuit of claim 5, wherein the test mode controlling unit further includes a latching unit configured to maintain a level of the output signal of the first inverting unit that is supplied to the second inverting unit.

11. The test mode control circuit of claim 1, wherein the input unit is configured to further receive a test mode command.

12. The test mode control circuit of claim 11, wherein the input unit includes:

a NAND gate configured to perform NAND operation on the test mode command and the test mode data; and an inverter configured to invert an output signal of the NAND gate.

13. A method of controlling a test mode of a semiconductor memory device, comprising:

performing an input operation for inputting test mode data for at least one of a plurality of test modes; and performing a control operation for controlling the test mode to be alternately enabled and disabled according to the number of times the test mode data is inputted.

14. The method of claim 13, wherein performing the control operation includes:

generating a first level of a test control signal to enable the test mode when the test mode data is inputted; and generating a second level of the test control signal to disable the test mode when the test mode data is inputted again.

15. The method of claim 14, further comprising:

generating the test control signal to disable the plurality of test modes when a predetermined reset signal is inputted.

16. The method of claim 13, wherein performing the control operation includes:

alternately generating a first level control signal in response to an input of the test mode data, and a second level signal in response to a re-input of the test mode data; and generating the test control signal to enable the test mode when the first level control signal is inputted and to disable the test mode when the second level control signal or a reset signal is inputted.

17. The method of claim 16, further comprising:

performing a first inversion operation for inverting the test control signal; and performing a second inversion operation for inverting an output signal of the first inversion operation to output the test control signal.

18. The method of claim 16, wherein the first level control signal and the second level control signal are alternately generated by a 1-bit counter.

19. The method of claim 16, wherein generating the test control signal includes:

performing an inversion operation for inverting the first and second level control signals; and performing a NOR operation on the reset signal and an output signal of the inversion operation.

20. The method of claim 13, wherein performing the input operation further includes inputting a test mode command.

21. The method of claim 18, wherein performing the input operation includes:

performing a NAND operation on the test mode command and the test mode data; and performing an inversion operation for inverting an output signal of the NAND operation.

* * * * *